United States Patent
Morinaga et al.

(10) Patent No.: US 6,518,655 B2
(45) Date of Patent: Feb. 11, 2003

(54) MULTI-CHIP PACKAGE-TYPE SEMICONDUCTOR DEVICE

(75) Inventors: Yuichi Morinaga, Tokyo (JP); Kiyoshi Hasegawa, Tokyo (JP); Kenji Fuchinoue, Miyasaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/975,198

(22) Filed: Oct. 12, 2001

(65) Prior Publication Data

US 2002/0047214 A1 Apr. 25, 2002

(30) Foreign Application Priority Data

Oct. 16, 2000 (JP) .................................. 2000-314988

(51) Int. Cl.[7] .............................................. H01L 23/02
(52) U.S. Cl. ...................................... 257/678; 257/686
(58) Field of Search ................................ 257/678, 684, 257/685, 686, 687, 777, 776, 723, 724, 725; 438/106, 109, 127, 112

(56) References Cited

U.S. PATENT DOCUMENTS

| | | | | |
|---|---|---|---|---|
| 5,666,004 A | * | 9/1997 | Bhattacharyya et al. | 257/724 |
| 6,177,721 B1 | * | 1/2001 | Suh et al. | 257/686 |
| 6,307,257 B1 | * | 10/2001 | Huang et al. | 257/676 |
| 6,316,727 B1 | * | 11/2001 | Liu | 174/52.4 |
| 6,343,019 B1 | * | 1/2002 | Jiang et al. | 361/761 |
| 6,365,833 B1 | * | 4/2002 | Eng et al. | 174/52.2 |

FOREIGN PATENT DOCUMENTS

| | | | |
|---|---|---|---|
| JP | 60-245291 | 12/1985 | ............ H05K/1/18 |
| JP | 07-169905 | 7/1995 | ......... H01L/25/065 |

* cited by examiner

Primary Examiner—Michael Sherry
Assistant Examiner—Scott B Geyer
(74) Attorney, Agent, or Firm—Junichi Mimura

(57) ABSTRACT

A multi-chip package type semiconductor device includes a first insulating substrate having a hollow on its main surface, a second insulating substrate having on its main surface an opening, which is larger than the hollow, and being on the first substrate wherein the opening encompasses the hollow, a first semiconductor chip being formed in the hollow, a second first semiconductor chip whose size is approximately the same as that of the first semiconductor chip, being supported by the first insulating substrate in an area, which encompasses the hollow.

7 Claims, 8 Drawing Sheets

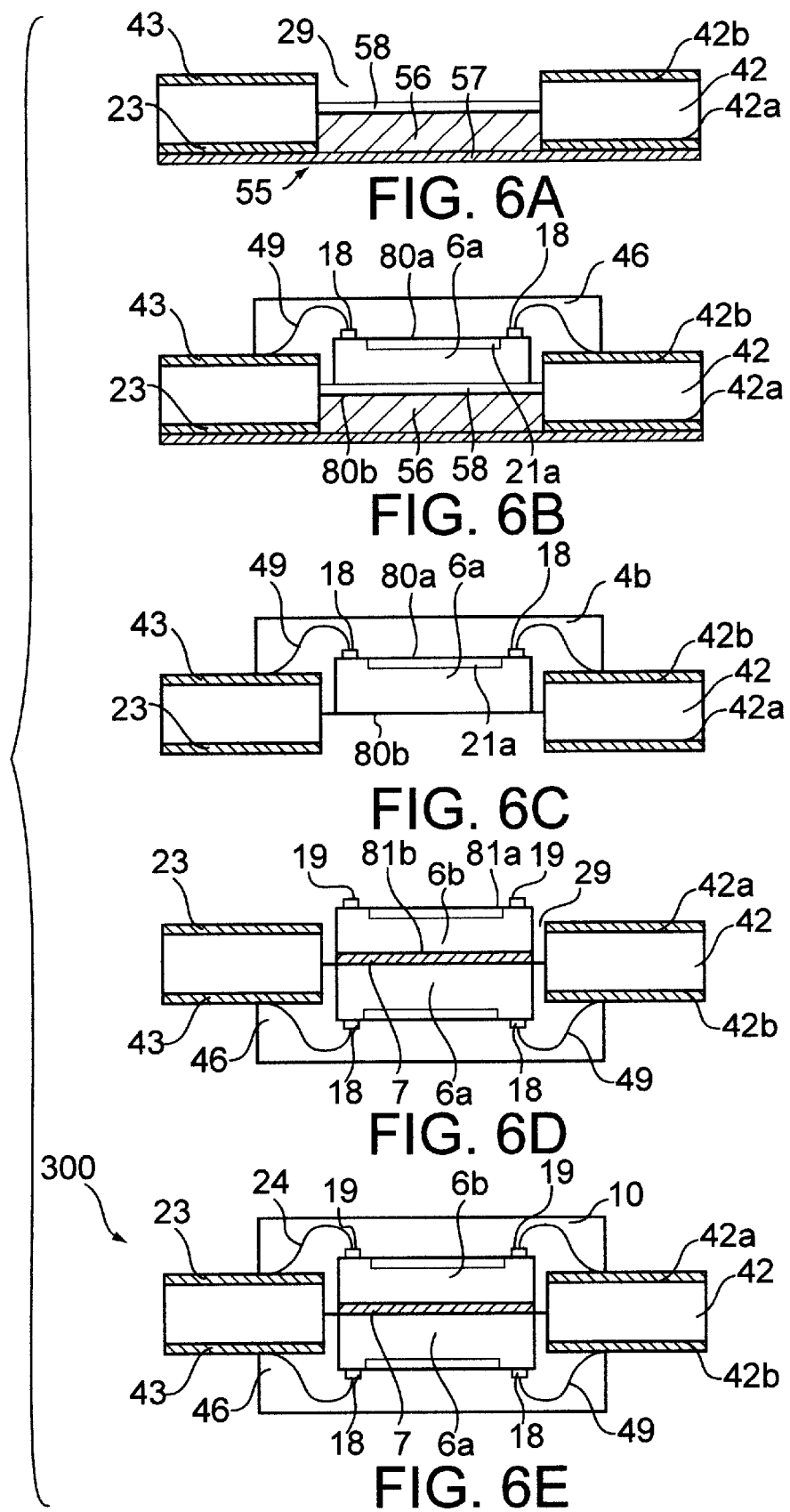

MULTI-CHIP PACKAGE-TYPE SEMICONDUCTOR DEVICE

CROSS-REFERENCE TO RELATED APPLICATION

This application claims the priority benefit of Japanese Patent Application No. 2000-314988, filed Oct. 16, 2000, the entire disclosure of which is incorporated herein by reference.

BACKGROUND OF THE INVENTION

1. Field of the Invention

This invention relates to a semiconductor device, and more particularly, to a multi-chip package-type semiconductor device in which more than one IC chip can be packaged.

2. Description of the Related Art

In the related art, there are several types of multi-chip packages in which more than one IC chip can be packaged. One typical multi-chip package is a stack-type multi-chip package that packages at least two IC chips in a stacked manner.

In the stack-type multi-chip package, the semiconductor device includes an insulating substrate on which conductive patterns are formed, a first semiconductor chip, and a second semiconductor chip mounted on the first semiconductor chip. Each of the semiconductor chips includes terminal pads in a peripheral area on its main surface. An adhesive material is formed on the main surface of the first semiconductor chip except for the terminal pad in order to fix the second semiconductor chip on the first semiconductor chip. More concretely, a back surface of the second semiconductor chip is adhered to a center of the main surface of the first semiconductor chip.

In such a device, after the second semiconductor chip is mounted on the first semiconductor chip, each terminal pad of each of the first and second semiconductor chips is connected to one of the conductive patterns formed on the insulating substrate by a bonding wire so that each semiconductor chip is connected electrically to the insulating substrate. Further, the semiconductor chips and bonding wires are encapsulated by a sealing material, such as a resin.

Therefore, in such a multi-chip package-type semiconductor device, since the second semiconductor chip is directly mounted on the first semiconductor device, the size of the second semiconductor chip should be smaller than that of the first semiconductor chip. That is, the second semiconductor is mounted in the center area of the main surface of the first semiconductor device so that the terminal pads of the first semiconductor device are exposed for connection to bonding wires. Further, the surface of the remainder of the peripheral area also is exposed. Therefore, the size of the second semiconductor chip should not only be smaller than that of the first semiconductor chip, but also be determined by the size of the peripheral area of the first semiconductor chip.

As a result, according to the above described multi-chip package-type semiconductor device, it is almost impossible to stack first and second semiconductor chips having the same size because the first semiconductor chip should have an exposed peripheral area that is not covered by the second semiconductor chips.

To overcome this limitation, some others have been introduced. One typical example is disclosed in Japanese Patent Publication 60-245291. A multi-chip package-type semiconductor device disclosed in that publication includes an insulating substrate having an opening and first and second semiconductor chips stacked with their back surfaces. The first and second semiconductor chips are placed in the opening. In this type of the multi-chip package-type semiconductor device, since the first and second semiconductor chips are connected to each other at their back surfaces, they may be of the same size. However, according to that reference, an adhesive tape are formed on the main surface of one of the semiconductor chips on which a circuit is formed, and then, the adhesive tape is removed for the following steps. Therefore, this step of removing the adhesive tape formed on the circuit may cause damage to the circuit.

SUMMARY OF THE INVENTION

It is therefore an object of the invention to resolve the above-described problems in a multi-chip package-type semiconductor device and provide a multi-chip package-type semiconductor device having two stacked, same size semiconductor chips.

The object is achieved by a multi-chip package-type semiconductor device including a first insulating substrate, a second insulating substrate, a first semiconductor chip, a second semiconductor chip of approximately the same size as the first semiconductor chip and bonding wires.

The first insulating substrate includes a first surface and the second surface opposite to the first surface wherein the first insulating substrate has a recess at the first surface. The second insulating substrate includes a first surface and the second surface opposite to the first surface wherein the second insulating substrate further has on the first surface an opening that is larger than the recess, and conductive patterns. Further the second insulating substrate is on the first substrate wherein the opening encompasses the recess. The first semiconductor chip formed in the recess includes a first surface and the second surface opposite to the first surface wherein the first semiconductor chip includes on the first surface a first terminal pad and a first circuit, which is connected to the first terminal pad. The second semiconductor chip includes a first surface and a second surface opposite to the first surface wherein the second semiconductor chip further has on the first surface a second terminal pad and a second circuit, which is connected to the second terminal pad. Further, the second semiconductor chip is supported by the first insulating substrate in an area of the first surface, which is exposed by the opening. The bonding wires connect the first terminal pad to one of the conductive patterns, and for connecting the second terminal pad to another one of the conductive patterns.

The above and further objects and novel features of the invention will more fully appear from the following detailed description, appended claims and accompanying drawings.

BRIEF DESCRIPTION OF THE DRAWINGS

FIGS. 6A–6E are sectional views showing successive stages of the manufacture of the multi-chip package-type semiconductor device according to the third embodiment.

DETAILED DESCRIPTION OF THE PREFERRED EMBODIMENTS

First Preferred Embodiment

Figures 1A, 1B:
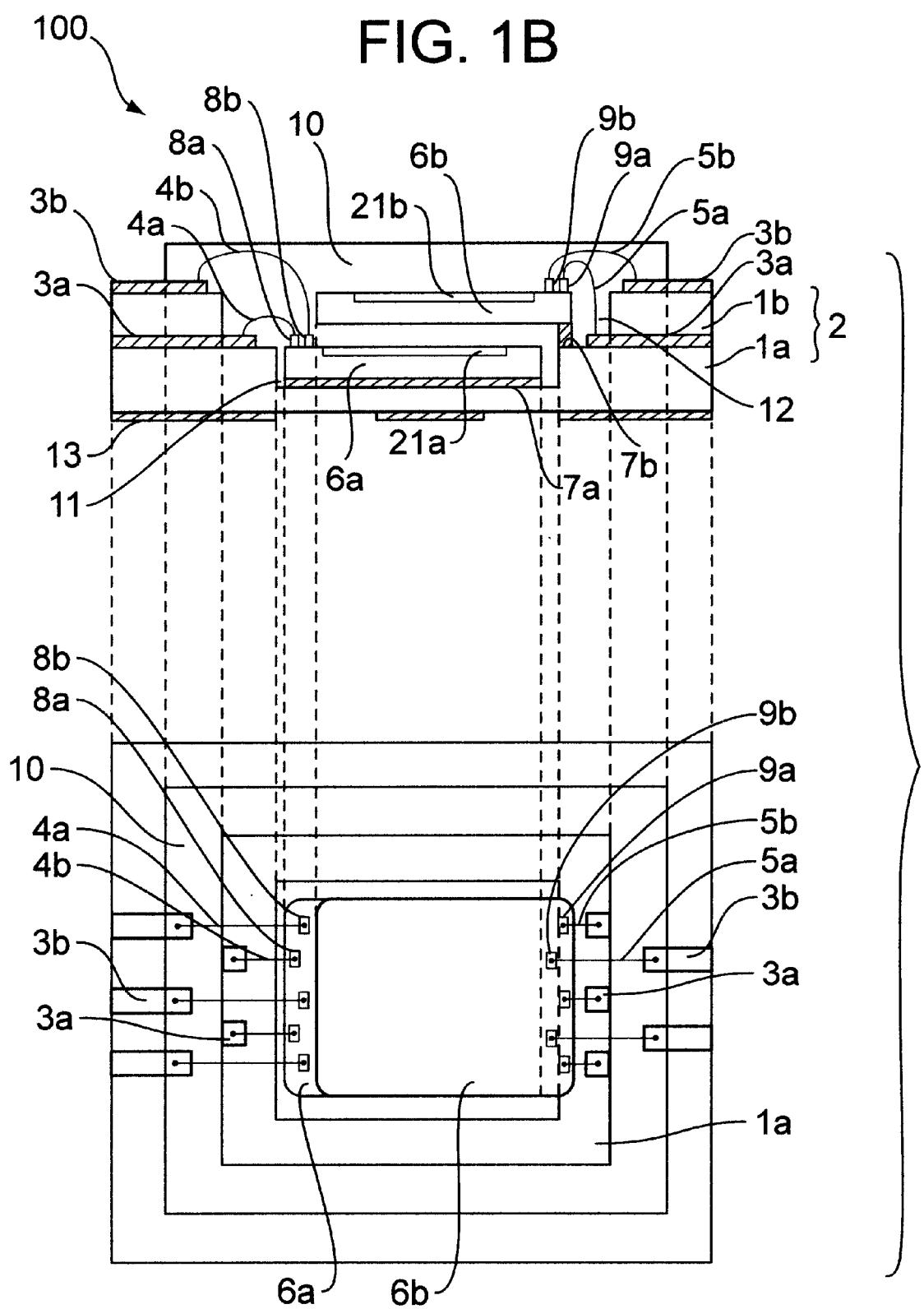
FIG. 1A is a plan view of a multi-chip package-type semiconductor device according to a first embodiment of the invention.
FIG. 1B is a sectional view of the multi-chip package-type semiconductor device of FIG. 1.

Referring to FIGS. 1A and 1B, a multi-chip package-type semiconductor device 100 includes a multi-stacked substrate 2 having a first insulating substrate 1a and a second insulating substrate 1b formed on the first insulating substrate 1a, a first semiconductor chip 6a and a second semiconductor chip 6b. The multi-stacked substrate 2 is formed of a glass epoxy resin. The first insulating substrate 1a includes a main surface and a back surface. First conductive patterns 3a are formed on the main surface, and back surface conductive patterns 13 are formed on the back surface. The second insulating substrate 1b includes a main surface and a back surface, and second conductive patterns 3b are formed on the main surface. The first and second semiconductors are formed on the multi-stacked substrate 2. The first semiconductor chip 6a includes first terminal pads 8a in a peripheral area of the main surface, which are arranged in a line along one of the sides of the first semiconductor chip 6a, and includes second terminal pads 8b in the same area on the same surface, which are arranged in a line along the same side. The first terminal pad 8a is located closer to the side than the second terminal pad 8b. The first semiconductor chip 6a also includes a first circuit 21a on the main surface. Similarly, the second semiconductor chip 6b includes first terminal pads 9a in its peripheral area on the main surface, which are arranged in a line along one of the sides of the second semiconductor chip 6b, and includes second terminal pads 9b in the same area on the same surface, which are arranged in a line along the same side. The first terminal pad 9a is located closer to the side than the second terminal pad 9b. The first and second terminal pads 8a, 8b of the first semiconductor chip 6a are opposite to the first and second terminal pads 9a, 9b of the second semiconductor chip 6b. The second semiconductor 6b also includes a second circuit 21b on the main surface.

The first and second semiconductor chips 6a, 6b may be or may not be of the same kind. However, the size of the first semiconductor chip 6a is almost the same as that of the first semiconductor chip 6b. Therefore, if the first and second semiconductor 6a, 6b are of the same size, then, in accordance with the first embodiment of the invention, the first semiconductor chip 6a can be a memory and the second semiconductor chip 6b can be a logic circuit.

The first insulating substrate 1a includes a recess 11 in the main surface that is larger than the first semiconductor chip 6a. The first semiconductor chip 6a is fixed in the recess 11 by an insulative adhesive material 7a such as an epoxy resin or an epoxy tape, wherein the back surface of the first semiconductor chip 6a is facing the bottom of the recess 11. The second insulating substrate 1b includes an opening 12 is larger than the second semiconductor chip 6b and than the recess 11. As described above, although the second insulating substrate 1b is placed on the first insulating substrate 1a, the peripheral area of the first insulating substrate 1a in which the first terminal pads 8a are formed, is not covered by the second insulating substrate 1b because the opening 12 formed in the second insulating substrate 1b is larger than the recess 11 formed in the first insulating substrate 1a. The second semiconductor chip 6b is placed in the opening 12 and fixed on the first insulating substrate 1a by an insulative adhesive material 7b such as an epoxy resin or an epoxy tape wherein the back surface of the second semiconductor chip 6b is facing the main surface of the first insulating substrate 1a. Since the second semiconductor chip 6b is supported by the first insulating substrate 1a only in an area on the main surface which is exposed by the opening 12, there is a space between the first and second semiconductor chip 6a, 6b.

The first terminal pads 8a of the first semiconductors chip 6a are connected to the first conductive pattern 3a of the first insulating substrate 1a by bonding wires 4a, and the second terminal pads 8b of the first semiconductor chip 1a are connected to the second conductive pattern 3b of the second insulating substrate 1b by bonding wires 4b. The first terminal pads 9a of the second semiconductors chip 6b are connected to the first conductive pattern 3a of the first insulating substrate 1a by bonding wires 5a, and the second terminal pads 9b of the second semiconductor chip 6b are connected to the second conductive pattern 3b of the second insulating substrate 1b by bonding wires 5b. The first and second semiconductor chips 6a, 6b and the bonding wires 4a, 4b, 5a, 5b are encapsulated completely by a sealing material 10 such as an epoxy resin. The location of the top surface of the sealing material 10 is higher than the top location of a loop of the bonding wire 4a or 5b by 50 µm. Since the sealing material 10 is extended into the space between the first and second semiconductor chip 6a, 6b, the second semiconductor chip 6b is finally supported by the sealing material 10 and the first insulating substrate 1a.

According to the multi-chip package-type semiconductor device 100 of the first embodiment, the multi-stacked substrate 2 having a step formed by the first and second insulating substrate 1a, 1b, is used, the second semiconductor chip 6b can be placed in a location that is shifted from a location at which the first semiconductor chip 6a is placed. Therefore, the first and the second semiconductor chips used in the multi-chip package-type semiconductor device 100 may be of the same size.

Further, the second semiconductor chip 6b is not located above the peripheral area of the first semiconductor chip 6a in which the first and second terminal pads 8a and 8b are formed. Further, the first and second terminal pads 8a and 8b of the first semiconductor chip 1a, the first and second terminal pads 9a and 9b of the second semiconductor chip 1b, the first conductive patterns 3a of the first insulating substrate 1a and the second conductive pattern 3b of the second insulating substrate 1b can be located on the same side if the first and second semiconductor chip 6a, 6b are of the same size. Therefore, each terminal pad 8a, 8b, 9a, 9b can be connected to one of conductive patterns 3a, 3b in a single wire bonding process.

Moreover, the first and second terminal pads 8a, 8b of the first semiconductor chip 6a is quite opposite to the first and second terminal pads 9a, 9b of the second semiconductor chip 6b. According to this arrangement, it is possible to avoid unnecessary contact between the bonding wires 4a, 4b that connect the first semiconductor chip 6a to the multi-stacked substrate 2 and the bonding wires 5a, 5b that connect the second semiconductor chip 6b and the multi-stacked substrate 2.

When the multi-chip package-type semiconductor device 100 of the first embodiment is connected to an external device, a bump electrode acting as a terminal pad for the external device may be formed on the conductive patterns 3a, 3b.

Further, since the second semiconductor chip 6b is supported by the first insulating substrate 1b before an encapsulating process is performed by using the sealing material 10, the main surface of the first semiconductor chip 6a does not contact the back surface of the second semiconductor chip 6b. As described above, the first circuit 21a is formed on the main surface of the first semiconductor chip 6a. Since the main surface of the first semiconductor chip 6a does not contact the back surface of the second semiconductor chip 6b, the first circuit 21a is not damaged.

Figure 1C:
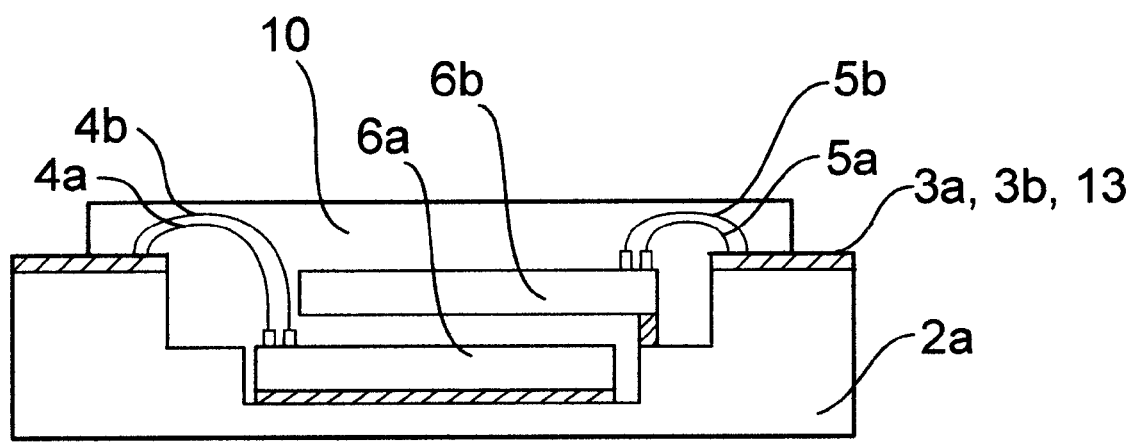
FIG. 1C is a sectional view of the multi-chip package-type semiconductor device according to an alternative of the first embodiment of the invention.

In the multi-chip package-type semiconductor device 100 of the first embodiment, although the first conductive patterns 3a and the back surface conductive patterns 13 are formed on the first insulating substrate 1b, the first conductive patterns 3a can be formed on the main surface of the second insulating substrate 1b and conductive patterns corresponding to the back surface conductive patterns 13 also can be formed on the main surface of the second insulating substrate 1b. In this case, the first and second insulating substrate 1a, 1b can be formed as a single integral structure 2a as shown in FIG. 1C. Further, the first and second conductive patterns 3a, 3b can be connected to each other by an internal conductive pattern, which is formed in the second insulating substrate 1b.

In the multi-chip package-type semiconductor device 100 of the first embodiment, the second semiconductor chip 6b is fixed on the first insulating substrate 1b by the adhesive material 7a before the encapsulating process is performed by using the sealing material 10. In such a structure, it is better to avoid flowing the adhesive material onto the main surface of the first semiconductor chip 6a because the first circuit 21a is formed thereon. Therefore, the adhesive material is preferably of high viscosity or is an the epoxy tape.

However, when high tackiness cannot be obtained by the adhesive material having high viscosity or the epoxy tape, in order to support the second semiconductor chip 6b, an extra adhesive material may be formed on the main surface of the first semiconductor chip 6a to support the second semiconductor chip 6b by the first semiconductor chip 6a. The extra adhesive material may be formed on the entire area except for the periphery in which the first bonding pads 8a are formed, or be formed on a particular area on the main surface of the first semiconductor chip 6a corresponding to the edge of the second semiconductor chip 6b. In this case, since the adhesive material is formed on the first circuit 21a of the first semiconductor chip 6a directly, it is necessary not to make damage to the circuit of the first semiconductor chip 6a when the extra adhesive material is formed.

Second Preferred Embodiment

Figure 2:
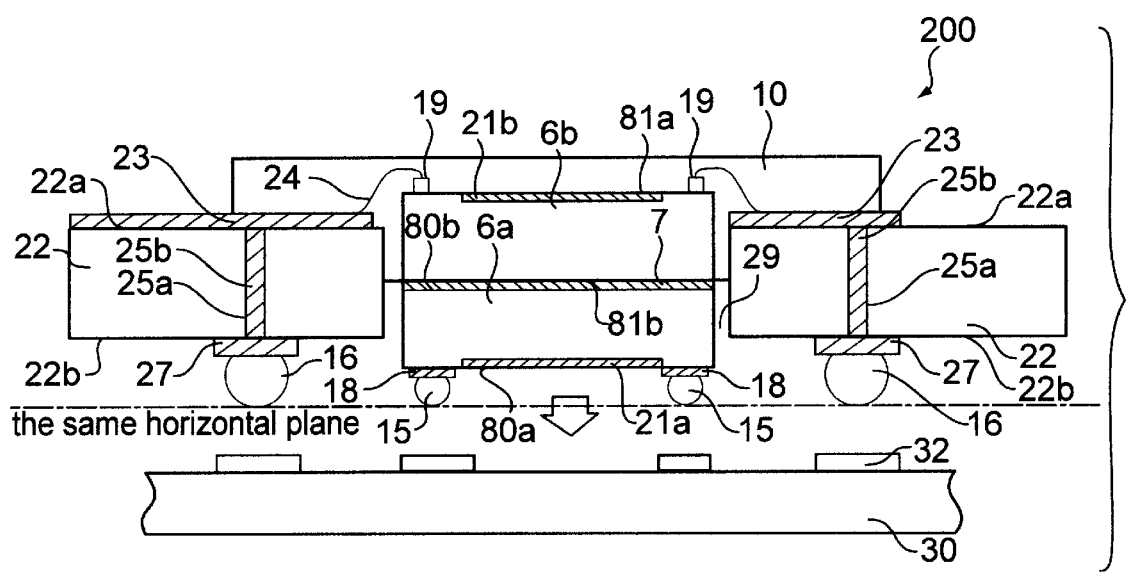
FIG. 2 is a sectional view of a multi-chip package-type semiconductor device according to a second embodiment of the invention.

FIG. 2 shows a multi-chip package-type semiconductor device 200 according to a second embodiment, In the second embodiment, the same reference numbers in FIGS. 1A and 1B designate the same or similar components in FIG. 2.

Referring to FIG. 2, the multi-chip package-type semiconductor device 200 includes an insulating substrate 22 having an opening 29, a first semiconductor chip 6a and a second semiconductor chip 6b. The insulating substrate 22 is formed of a glass epoxy resin. The first semiconductor chip 6a has a main surface 80a and a back surface 80b, and first circuits 21a and first terminal pads 18 having first bump electrodes 15, which is connected to the first circuits 21a, are formed on the main surface 80a. The second semiconductor chip 6b has a main surface 81a and a back surface 81b, and second circuits 21b and second terminal pads 19, which are connected to the second circuits 21b, are formed on the main surface 81a. The first and second semiconductor chips 6a, 6b have approximately the same size, and they are fixed to each other at their back surfaces 80b, 81b by an adhesive material 7 such as an epoxy resin having an insulating characteristic. The opening 29 is formed larger than the first and second semiconductor 6a, 6b so that the first and second semiconductor chips can be placed in the opening 29 of the insulating substrate 22.

The insulating substrate 22 having a main surface 22a and back surface 22b includes a conductive pattern 23 formed on the main surface 22a and third terminal pads 27 having second bump electrodes 16 on the back surface 22b. The insulating substrate 22 further includes through-holes 25a and internal conductive patterns 25b formed in the through-holes 25a. Therefore, the conductive pattern 23 is connected to the third terminal 27 by the internal conductive patterns 25b.

Each second terminal pad 19 of the second semiconductor chip 6b is connected to one of the conductive patterns 23 by the bonding wire 24. The second semiconductor chip 6b and the bonding wire 24 are encapsulated completely by a sealing material 10. The second semiconductor chip 6b is fixed to the insulating substrate 22 by the sealing material 10, which is extended into a space formed between a side surface of the second semiconductor chip 6b and a side surface of the insulating substrate 22. Further, an unillustrated passivation layer, such as an epoxy resin, is formed on the entire main surface 80a of the first semiconductor device 6a except for on the first terminal pad in order to protect the circuits 21a formed on the main surface 80a of the first semiconductor device 6a.

The multi-chip package-type semiconductor device 200 is mounted on and connected to an external device 30 such as a motherboard having a circuit pattern 32 by the well-known face-down bonding. By contacting the first bump electrodes 15 on terminal pad 18 and the second bump electrodes 16 on the third terminal pad 27 to the circuit pattern 32 on the external device 30, the electrical connection between the multi-chip package-type semiconductor device 200 and the external device 30 is made. To make a fine connection between the multi-chip package-type semiconductor device 200 and the external device 30, it is essential to form the tops of the first and second bump electrodes 15, 16 to be located in the same horizontal plane. Since the first semiconductor chip 6a is projected from the insulating substrate 22, the size of each first bump electrode 15 should be smaller than that of the second bump electrode 16 in order to adjust the tops of the first and second bump electrodes 15, 16 in the same horizontal plane.

In the second embodiment, although the third terminal pads 27 are formed on the back surface 22b of the insulating substrate 22, some conductive patterns can be formed on the back surface 22b of the insulating substrate 22 as well as on the main surface 22a. In this case, by forming some extra terminal pads and some extra bump electrodes on the conductive patterns, it is possible to connect the conductive patterns to the external device via the extra terminal pads and the extra bump electrodes.

According to the second embodiment, since the first and the second semiconductor chips 6a, 6b, which are stacked at their back surfaces 80b, 81b, are placed in the opening 29 of the insulating substrate 22, the second semiconductor chip 6b is not mounted on the first circuits 21a formed on the first semiconductor chip 6a. Therefore, the shape of the second semiconductor chip 6b is not restricted by the first terminal pads 18 of the first semiconductor chip 6a. As a result, the first and the second semiconductor chips 6a, 6b having the same size can be stacked to each other. Further, since the first and the second semiconductor chips 6a, 6b, which are stacked to each other at their back surfaces 80b, 81b, are placed in the opening 29 of the insulating substrate 22, the first circuits 21a formed on the main surface 80a of the first semiconductor chip 6a are not damaged.

Further, comparing the first embodiment, since the first and the second semiconductor chips 6a, 6b, having the same size is placed in the single opening 29, the multi-chip package-type semiconductor device 200 having a thin structure can be presented.

In addition, since the tops of the first and the second bump electrodes 15,16, which are connected to the first and second circuit 21a, 21b, are located in the same horizontal plane, it is easy to connect the multi-chip package-type semiconductor device 200 to the external device 30 by the face-down bonding method.

Figure 3A:
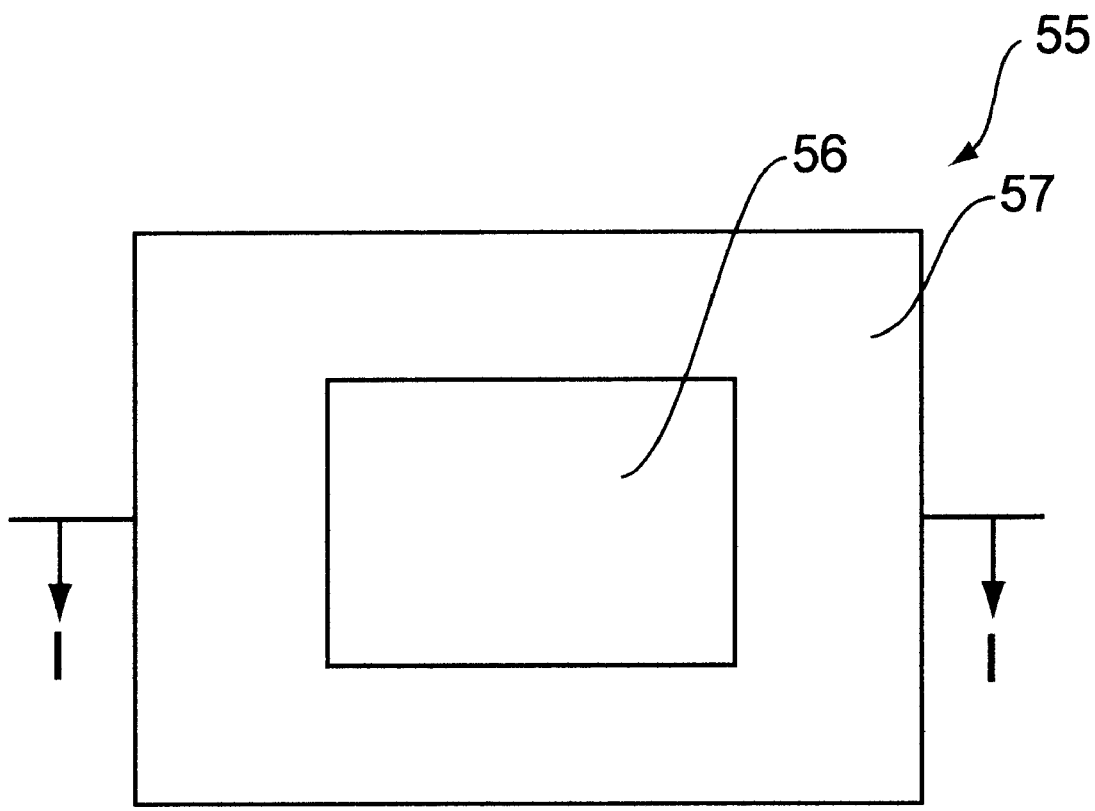
FIG. 3A is a plan view of a supporting member, which is used in the process of forming the multi-chip package-type semiconductor device according to the second embodiment.
Figure 3B:
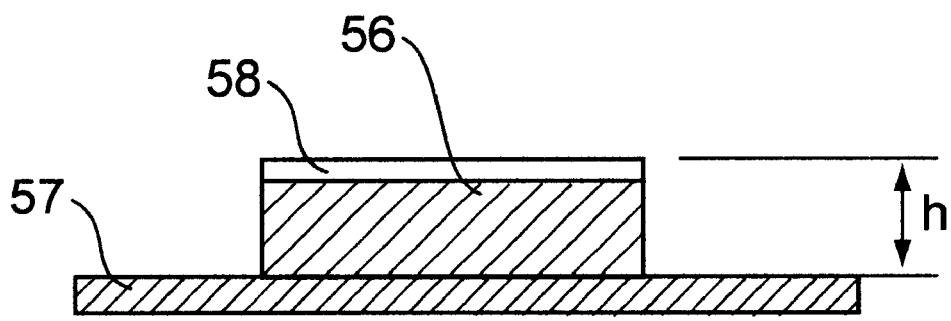
FIG. 3B is a cross-sectional view taken on line I—I of FIG. 3A.

The multi-chip package-type semiconductor device 200 is formed in the processes shown in FIGS. 4A–4E using a supporting member 55 shown in FIGS. 3A and 3B. First, the supporting member 55 is explained.

Referring to FIG. 3A and FIG. 3B, the supporting member 55 includes an adhesive tape 57 and a stand 56. On the top surface of the stand 56, an adhesive material 58, such as an UV tape is formed. The stand 56 is formed of a thermosetting resin. Further, the adhesive tape 57 may be formed of a UV tape. Alternatively, the stand 56 itself may be formed of a thick UV tape.

The width of the stand 56 is smaller than that of the opening 29 of an insulating substrate 22 shown in FIG. 2. Although the height (h) of the stand 56 should be lower than the thickness of the insulating substrate 22, the height (h) of the stand 56 is changed in response to a thickness of a first semiconductor chip 6a. The area of the top surface of the stand 56 is determined by the area of the back surface 81b of the second semiconductor chip 6b. That is, although the area of the top surface of the stand 56 should be smaller than that of the opening 29 because the stand 56 is inserted into the opening 29, the area of the top surface of the stand 56 should be larger than or approximately the same as the area of the back surface 81b of the second semiconductor chip 6b to avoid forming the sealing material layer on the back surface 81b of the second semiconductor chip 6b. In other words, the area of the top surface of the stand 56, which is approximately the same as the area of the opening 29 can avoid allowing the sealing material to extend to the back surface 81b of the second semiconductor chip 6b.

As described above, although the adhesive tape 57 and the adhesive material 58 are formed of the UV tape, they may be formed of a thermal volatile tape. Adhesion of these tapes is decreased by ultraviolet irradiation or heating. Therefore, the adhesive tape 57 and the adhesive material 58 are removed easily from the insulating substrate 22 and the second semiconductor chip 6b by ultraviolet irradiation or heating, and the second semiconductor chip 6b is not damaged.

The multi-chip package-type semiconductor device 200 is formed by using the supporting member 55 described above, and is explained with reference to FIGS. 4A–4E below.

Figure 4A:
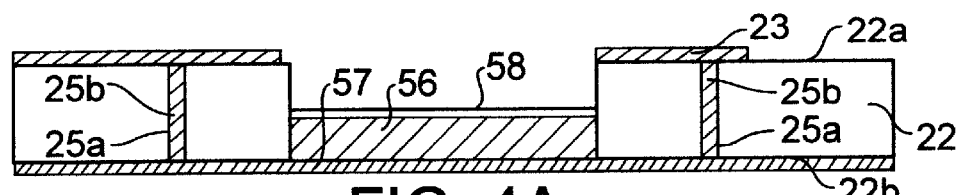
FIGS. 4A–4E are sectional views showing successive stages of the manufacture of the multi-chip package-type semiconductor device according to the second embodiment.

As shown in FIG. 4A, the insulating substrate 22 having the main surface 22a and back surface 22b is prepared. The insulating substrate 22 includes the conductive layers 23 on the main surface 22a of the insulating substrate 22 and the internal conductive patterns 25b formed in the through holes 25a. As described above, the insulating substrate 22 further includes the opening 29 whose size is larger than that of the first and second semiconductor chips 6a, 6b; which will be placed therein later. The supporting member 55 is adhered to the back surface 22b of the insulating substrate 22 by the adhesive tape 57 wherein the stand 56 is inserted into the opening 29 from a first side at which the back surface 22b of the insulating substrate 22 is located. As described above, the width of the stand 56 is smaller than or almost the same as that of the opening 29, it is possible to insert the stand 56 in the opening 29.

Figure 4B:
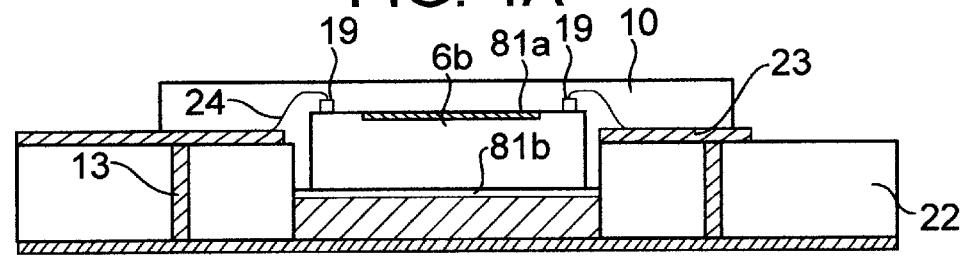

Next, as shown in FIG. 4B, the second semiconductor chip 6b is placed in the opening 29 from the second side, which is opposite to the first side, and then, is fixed on the stand 56 by the adhesive material 58. In this step, since the second terminal pads 19 and a second circuit 21b are formed on the main surface 81a of the second semiconductor chip 6b, the back surface 81b of the second semiconductor chip 6b is adhered to the stand 56. Then, each second terminal pad 19 is connected to one of the conductive patterns 23 by a bonding wire 24. Then, the second semiconductor chip 6b and the bonding wires 24 are encapsulated by a sealing material 10. The second semiconductor chip 6b is fixed to the insulating substrate 22 by the sealing material 10, which extended into a space between the side surface of the second semiconductor chip 6b and the side surface of the insulating substrate 22. Since the area of the top surface of the stand 56 is larger than or approximately the same as the area of the back surface 81b of the second semiconductor chip 6b, the sealing material 10 cannot reach the back surface 81b of the second semiconductor chip 6b passing through the space.

Figure 4C:
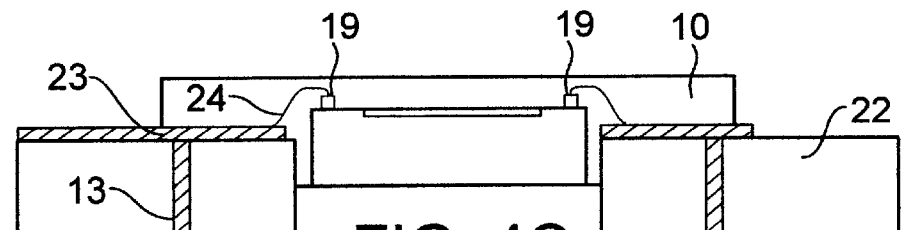

Then, as shown in FIG. 4C, the supporting member 55 is detached from the insulating substrate 22 and the second semiconductor chip 6b by the UV irradiation. According to the characteristic of the UV tape, any adhesive material does not remain on the back surface 22b of the insulating substrate 22 and on the back surface 81b of the second semiconductor chip 6b.

Figure 4D:
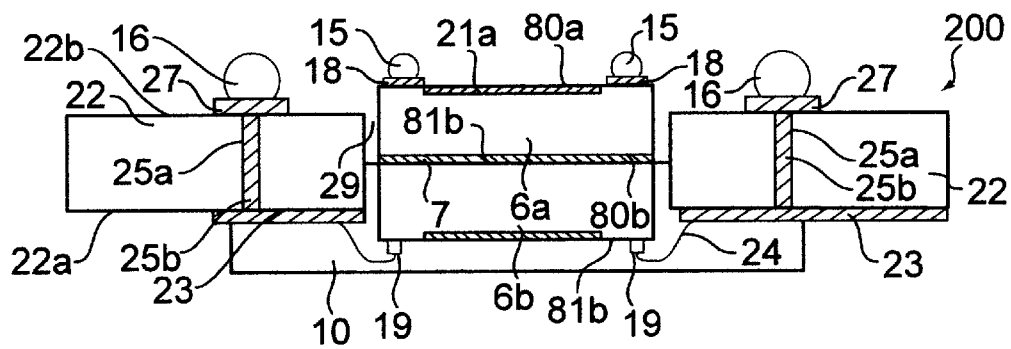

Referring to FIG. 4D, the insulating substrate 22 is tuned over. Then, the insulative adhesive material 7 is formed on the back surface 81b of the second semiconductor chip 6b. Then, the first semiconductor chip 6a having the first terminal pads 18 is prepared. The first semiconductor chip 6a of approximately the same size as the second semiconductor chip 6b is placed in the opening 29 from the first side, and then, is fixed on the back surface 81 b of the second semiconductor chip 6b by the adhesive material 7. Since the first terminal pads 18 and the first circuit 21a are already formed on the main surface 80a of the first semiconductor chip 6a, the back surface 80b of the first semiconductor chip 6a is adhered to the back surface 81b of the second semiconductor chip 6b. That is, the first and second semiconductor chips 6a, 6b having the same size are coupled to each other at their back surfaces 80b, 81b by the adhesive material 7, and are placed in the opening 29. Then, the third terminal pads 27, which are connected to the internal conductive patterns 25b, are formed on the back surface 22b of the insulating substrate 22. Then, the first bump electrodes 15 and the second bump electrodes 16 are formed on the first and third terminal pads 18, 27, respectively. Here, it is essential to form the tops of the first and second bump electrodes 15, 16 to be located in the same horizontal plane. Since the main surface 80a of the first semiconductor chip 6a is projected from the back surface 22b, it is necessary to formed the second bump electrode 16 larger than the first bump electrode 15 in order to locate the tops of the first and second bump electrodes 15, 16 in the same horizontal plane. However, since the size of the second bump electrode 16 may be limited because of its material characteristic, the location of the first semiconductor chip 6a is adjusted. The location of the first semiconductor chip 6a is determined by the location of the second semiconductor chip 6b, which is determined by the height of the stand 58 used in FIG. 4A. Therefore, by adjusting the height of the stand 58, the tops of the first and second bump electrodes 15, 16 can be located in the same horizontal plane.

Figure 4E:
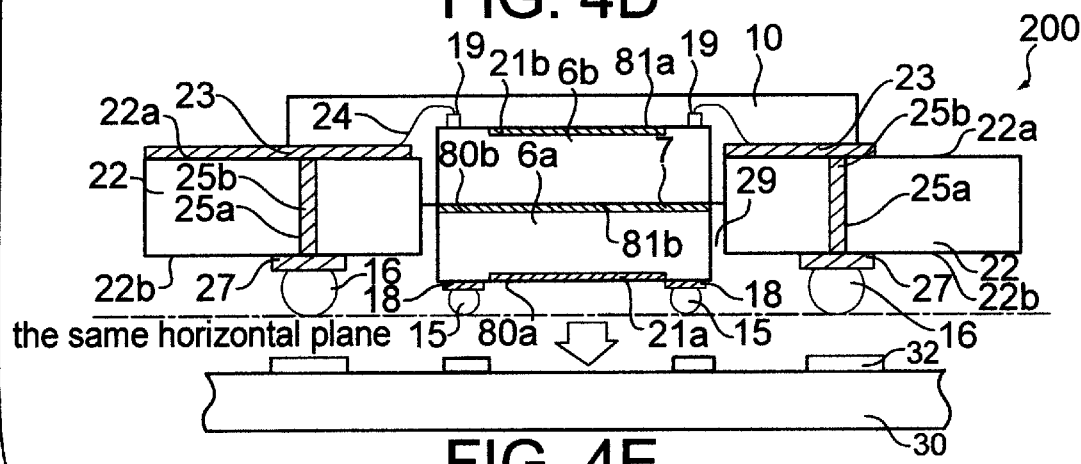

Then, as shown in FIG. 4E, the insulating substrate 22 is tuned over again, and then, the multi-chip package-type semiconductor device 200 is connected to the external device 30 by connecting the first bump electrodes 15 and the second bump electrodes 16 to the circuit pattern 32 formed on the external device 30 by the well-know face-down bonding method.

According to the method of forming the multi-chip package-type semiconductor device 200 of second embodiment, when the first semiconductor chip 6a is projected from the insulating substrate 22, the tops of the first and second bump electrodes 15, 16 can be located in the same horizontal plane by changing the size of the first and second bump electrodes 15, 16. Accordingly, the fine connection between the multi-chip package-type semiconductor device 200 and the external device 30 can be made by the face down bonding.

Further, according to the method of forming the multi-chip package-type semiconductor device 200 of the second embodiment, the second semiconductor chip 6b is fixed to the insulating substrate 22 by the sealing material by using the support member 55 first, and then, the first semiconductor chip 6b is placed on the back surface 81b of the second semiconductor chip 6a from the first side. Therefore, the main surfaces 80a, 81a on which the first and second circuits 21a, 21b and the first and second terminal pads 18, 19 are formed, are not contacted to each other in the manufacturing process. As a result, both of the first and second circuits 21a, 21b formed on the main surfaces 80a, 81a of the first and second semiconductor chips 6a, 6b are not damaged.

Third Preferred Embodiment

FIGS. 5 and 6A–6E show a multi-chip package-type semiconductor device 300 according to a third embodiments and the successive stages of the manufacture of the multi-chip package-type semiconductor device 300, respectively. In the third embodiment, the same reference numbers in FIGS. 1A and 1B, FIG. 2, FIGS. 3A, and 3b, or FIGS. 4A–4E designate the same or similar components in FIGS. 5 and 6A–6E.

Figure 5:
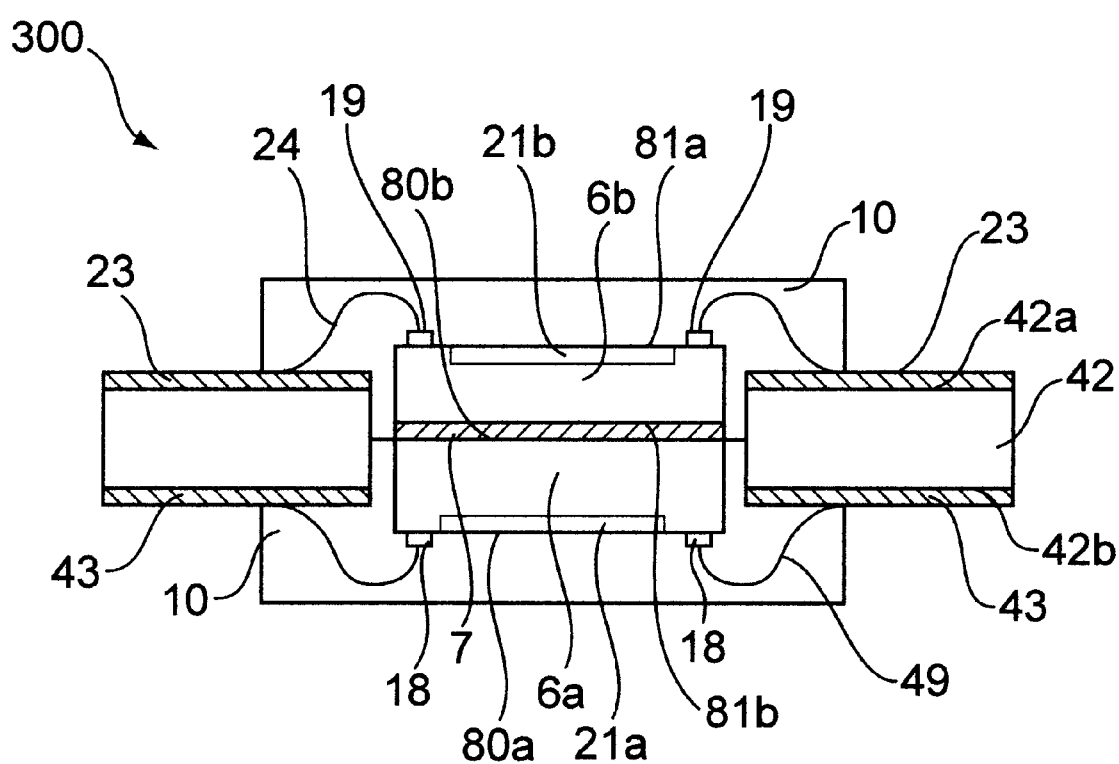
FIG. 5 is a sectional view of a multi-chip package-type semiconductor device according to a third embodiment of the invention.

In view of the structure, as shown in FIG. 5, the differences between the second and third embodiments are that a first terminal pads 18 formed on a first semiconductor chip 6a are connected to a second conductive pattern 43 formed on a back surface 42b of a insulating substrate 42 by a second bonding wire 49, and that both of the first semiconductor chip 6a and the second bonding wire are encapsulated by a sealing material in the third embodiment. The multi-chip package-type semiconductor device 300 are formed by the process below.

In the process of manufacturing the multi-chip package-type semiconductor device 300, the support member 55 is also used. The material and other specification of the support member 55 used in this process are similar to those of the support member 55 used in the second embodiment.

Referring to the FIGS. 6A through 6E, a series of the processes of manufacturing the multi-chip package-type semiconductor device are illustrated. As shown in FIG. 6A, an insulating substrate 42 having a main surface 42a and a back surface 42c is prepared. The insulating substrate 42 includes first conductive layers 23 on the main surface 42a of the insulating substrate 42 and second conductive layers 43 on the back surface 42b of the insulating substrate 42. The insulating substrate 42 further includes an opening 29 is larger than a first and second semiconductor chips 6a, 6b. The supporting member 55 is adhered to the main surface 42a of the insulating substrate 42 by the adhesive tape 57 wherein the stand 56 is inserted in the opening 29 from a second side at which the main surface 42b of the insulating substrate 42 is located. As described in the second embodiment, the width of the stand 56 is smaller than or almost the same as that of the opening 29, it is possible to insert the stand 56 in the opening 29.

Next, as shown in FIG. 6B, the first semiconductor chip 6a is placed in the opening 29 form a first side, which is opposite to the second side, and then, is fixed on the stand 56 by the adhesive material 58. In this step, since a first terminal pads 18 and a first circuit 21a are formed on the main surface 80a of the first semiconductor chip 6a, the back surface 80b of the first semiconductor chip 6a is adhered to the stand 56. Then, each first terminal pad 18 is connected to one of the second conductive patterns 43 by a bonding wire 49. Then, the first semiconductor chip 6a and the bonding wires 49 are encapsulated by a sealing material 46. The first semiconductor chip 6a is fixed to the insulating substrate 42 by the sealing material 46, which is extended into a space between a side surface of the first semiconductor chip 6a and a side surface of the insulating substrate 42. As described in the second embodiment, since the area of the top surface of the stand 56 should be larger than or approximately the same as the area of the back surface 80b of the first semiconductor chip 6a, the sealing material 46 cannot reach the back surface 80b of the first semiconductor chip 6a passing through the space.

Then, as shown in FIG. 6C, the supporting member 55 is detached from the insulating substrate 42 and the first semiconductor chip 6a by the UV irradiation. According to the characteristic of the UV tape, any adhesive material does not remain on the main surface 42a of the insulating substrate 42 and on the back surface 80a of the first semiconductor chip 6a. In other words, the area of the top surface of the stand 56, which is approximately the same as the area of the opening 29 can avoid allowing the sealing material to extend to the back surface 81b of the second semiconductor chip 6b.

Referring to FIG. 6D, the insulating substrate 42 is tuned over. Then, an insulative adhesive material 7 is formed on the back surface 80b of the first semiconductor chip 6a. The second semiconductor chip 6b of approximately the same size as the first semiconductor chip 6a is placed in the opening 29 from the second side, and then, is fixed on the back surface 80b of the first semiconductor chip 6a by the adhesive material 7. Since a second terminal pads 19 and a second circuit are already formed on the main surface 81a of the second semiconductor chip 6b, the back surface 81b of the second semiconductor chip 6b is adhered to the back surface 80b of the first semiconductor chip 6a. That is, the first and second semiconductor chips 6a, 6b having the same size are coupled to each other at their back surfaces 80b, 81b by the adhesive material 7, and placed in the opening 29.

Then, as shown in FIG. 6E, each second terminal pad 19 is connected to one of the first conductive patterns 23 by a bonding wire 24. Then, the second semiconductor chip 6b and the bonding wires 24 are encapsulated by sealing material 10. The second semiconductor chip 6b is fixed to the insulating substrate 42 by the sealing material 10, which enters into space between the second semiconductor chip 6b and the insulating substrate 42.

According to the third embodiment, since the first and the second semiconductor chips 6a, 6b, which are stacked at their back surfaces 80b, 81b, are placed in the opening 29 of the insulating substrate 42, the second semiconductor chip 6a is not mounted on the first circuits 21a formed on the first semiconductor chip 6a. Therefore, the shape of the second semiconductor chip 6b is not restricted by the first terminal pads 18 of the first semiconductor chip 6a. As a result, the first and the second semiconductor chips 6a, 6b having the same size can be stacked to each other. Further, since the first and the second semiconductor chips 6a, 6b, which are stacked to each other at their back surfaces 80b, 81b, are placed in the opening 29 of the insulating substrate 22, the first circuits 21a formed on the main surface 80a of the first semiconductor chip 6a are not damaged.

Further, comparing the first embodiment, since the first and the second semiconductor chips 6a, 6b, having the same size is placed in the single opening 29, the multi-chip package-type semiconductor device 300 having a thin structure can be presented.

Moreover, since the insulating substrate 42 includes opening 29 but a recess, it is easy to make. Therefore, the cost for forming the insulating substrate 42 can be reduced.

Furthermore, according to the method of forming the multi-chip package-type semiconductor device of third embodiment, the supporting member 55 is used, and the first semiconductor chip 6a is fixed on the stand 56. Therefore, the first semiconductor chip 6a can be fixed at a desired position by changing the height of the stand 56. As described above, the first and second semiconductor chip 6a, 6b having not only the same size, but also the different thickness can be used. When the first and second semiconductor chip 6a, 6b having the different thickness are used, the location of the back surfaces 80b, 81b of the first and second semiconductor chip 6a, 6b may not be in the middle of the opening 29 so that the distance from the main surface 42a of the insulating substrate 42 to the main surface 81a of the second semiconductor chip 6b can be the same as that from the back surface 42b of the insulating substrate 42 to the main surface 80a of the first semiconductor chip 6b. In this case, the sealing material 10 having the uniform thickness from the center of the insulating substrate 42 can be formed. Accordingly, it is possible to avoid being the insulating substrate 42 warped.

Further, according to the method of forming the multi-chip package-type semiconductor device 300 of third embodiment, the first semiconductor chip 6a is fixed to the insulating substrate 42 by the sealing material by using the support member 55 first, and then, the second semiconductor chip 6b is placed on the back surface 80b of the first semiconductor chip 6a. Therefore, the main surfaces 80a, 81a on which the first and second circuits 21a, 21b and the first and second terminal pads 18, 19 are formed are not contacted to each other in the manufacturing process. As a result, both the first and second circuits 21a, 21b formed on the main surfaces 80a, 81a of the first and second semiconductor chips 6a, 6b are not damaged.

Moreover, the connection between the first terminal pads 18 and the second conductive pattern 43 are made by the bonding wires 49 in the side of the main surface 42a of the insulating substrate 42. On the other hand, the connection between the second terminal pads 19 and the first conductive pattern 23 are made by the bonding wires 24 in the side of the back surface 42a of the insulating substrate 42. Therefore, unnecessary contacts between the bonding wires 49, 24 can be avoided.

Figure 6F:
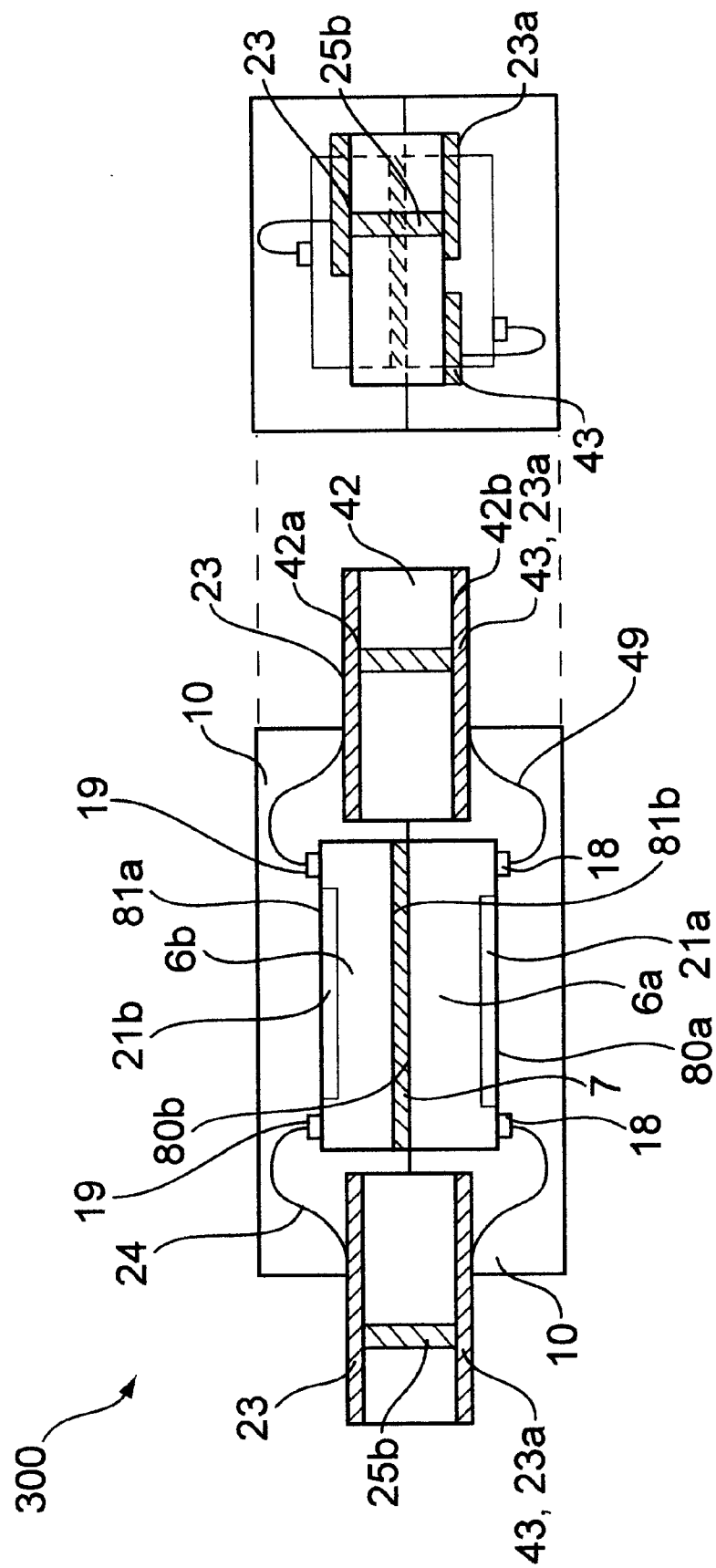
FIG. 6F is a sectional view of a multi-chip package-type semiconductor device according to an alternative of the third embodiment.

According to the third embodiment, the first conductive patterns 23 are formed on the main surface 42a of the insulating substrate 42. However, as shown in FIG. 6F, an extra conductive patterns 23a, which are used for connecting the external device, may be formed on the back surface 42b of the insulating substrate 42. In this case, internal conductive patterns 25b should be formed in the insulating substrate 42, and the first conductive patterns 23 are connected to the extra conductive patterns 23a by the internal conductive patterns 25b. According to this structure, since the extra conductive patterns 23a and the second conductive patterns 43 are formed on the single surface, the multi-chip package-type semiconductor device can be connected to an external device by a single wire bonding process.

While the present invention has been described with reference to illustrative embodiments, this description is not intended to be construed in a limiting sense. Various other modifications of the illustrated embodiments, as well as other embodiments of the invention, will be apparent to those skilled in the art on reference to this description. Therefore, the appended claims are intended to cover any such modifications or embodiments as fall within the true scope of the invention.

What I claim is:

1. A multi-chip package-type semiconductor device, comprising:
    a first insulating substrate having a first surface and the second surface opposite to the first surface, the first insulating substrate having a recess at the first surface;
    a second insulating substrate, the second insulating substrate having a first surface and the second surface opposite to the first surface, the second insulating substrate further having on the first surface an opening that is larger than the recess, and conductive patterns, and the second insulating substrate being on the first substrate wherein the opening encompasses the recess;
    a first semiconductor chip formed in the recess having a first surface and the second surface opposite to the first surface, the first semiconductor chip including on the first surface a first terminal pad and a first circuit, which is connected to the first terminal pad;
    a second semiconductor chip of approximately the same size as the first semiconductor chip, having a first surface and a second surface opposite to the first surface, the second semiconductor chip further having on the first surface a second terminal pad and a second circuit, which is connected to the second terminal pad, and the second semiconductor chip being supported by the first insulating substrate in an area of the first surface, which is exposed by the opening; and
    bonding wires connecting the first terminal pad to one of the conductive patterns, and for connecting the second terminal pad to another one of the conductive patterns.

2. A multi-chip package-type semiconductor device as claimed in claim 1 wherein the first and second insulating substrate is formed in a single integral structure.

3. A multi-chip package-type semiconductor device as claimed in claim 1 wherein the first terminal pad is opposite to the second terminal pad.

4. A multi-chip package-type semiconductor device as claimed in claim 1 wherein the conductive patterns are a second conductive patterns, the bonding wires are a second bonding wires, the first terminal pad is arranged into two lines and the second terminal pad is arranged into two lines, further including:
   a first conductive pattern formed on the first surface of the first insulating substrate; and
   first bonding wires, one of the first bonding wires connecting the first terminal pad in the first line to the first conductive pattern, another one of the first bonding wires connecting the second terminal pad in the first line to the first conductive pattern, one of the second bonding wires connecting the first terminal pad in the second line to the second conductive pattern, and another one of the second bonding wires connecting the second terminal pad in the second line to the second conductive pattern.

5. A multi-chip package-type semiconductor device, comprising:
   an insulating substrate having a first surface and a second surface opposite to the first surface, the insulating substrate having an opening, a conductive pattern on the first surface, a third terminal pad formed on the second surface, an internal conductive pattern connecting the conductive pattern to the third terminal pad and a second bump electrode formed on the third terminal pad;
   a first semiconductor chip having a first surface and a second surface opposite to the first surface, the first semiconductor chip having on the first surface a first terminal pad and a first circuit connected to the first terminal pad, the first semiconductor chip also having a first bump electrode on the first terminal pad, the first semiconductor chip being located in the opening wherein the first surface of the first semiconductors chip and the second surface of the insulating substrate being facing the same direction;
   a second semiconductor chip of approximately the same size as the first semiconductor chip, having a first surface and a second surface opposite to the first surface, the second semiconductor chip including on the first surface a second terminal pad and a second circuit connected to the second terminal pad, the first A semiconductor chip being placed in the opening and being fixed at its second surface on the second surface of the first semiconductor chip wherein the first surface of the second semiconductor chip and the first surface of the insulating substrate being facing the same direction;
   a bonding wire connecting the second terminal pad to the conductive pattern; and
   a sealing member encapsulating the second semiconductor chip and the bonding wire, and fixing the second semiconductor chip to the insulating substrate.

6. A multi-chip package-type semiconductor device as claimed in claim 5 wherein the first semiconductor chip is projected from the second surface of the insulating substrate, the first bump electrode being smaller than the second bump electrode, and the tops of the first and second bump electrode being located in the same horizontal plane.

7. A multi-chip package-type semiconductor device as claimed in claim 6, further including an external device having circuit patterns, each of which is connected directly to one of the first and second bump electrodes.

* * * * *